(12) United States Patent
Smethurst

(10) Patent No.: US 10,877,528 B2
(45) Date of Patent: Dec. 29, 2020

(54) CONFIGURABLE MODULAR COMPUTER ENCLOSURE

(71) Applicant: Nicholas Smethurst, Guildford (GB)

(72) Inventor: Nicholas Smethurst, Guildford (GB)

( * ) Notice: Subject to any disclaimer, the term of this patent is extended or adjusted under 35 U.S.C. 154(b) by 0 days.

(21) Appl. No.: 16/960,473

(22) PCT Filed: Jan. 15, 2019

(86) PCT No.: PCT/EP2019/050886
§ 371 (c)(1),
(2) Date: Jul. 7, 2020

(87) PCT Pub. No.: WO2019/141660
PCT Pub. Date: Jul. 25, 2019

(65) Prior Publication Data
US 2020/0379521 A1    Dec. 3, 2020

(30) Foreign Application Priority Data
Jan. 16, 2018 (GB) .................................. 1800665.0

(51) Int. Cl.
*G06F 1/18* (2006.01)
*H05K 7/14* (2006.01)

(52) U.S. Cl.
CPC .......... *G06F 1/181* (2013.01); *H05K 7/1487* (2013.01); *H05K 7/1494* (2013.01)

(58) Field of Classification Search
CPC ..... G06F 1/181; H05K 7/1487; H05K 7/1494
(Continued)

(56) References Cited

U.S. PATENT DOCUMENTS 3,264,525 A    8/1966  Swengel
6,816,390 B1 * 11/2004 Barringer ................ G06F 1/184
                                                              361/679.32
(Continued)

FOREIGN PATENT DOCUMENTS

DE    1261917 B    2/1968
DE    7247066 A    12/1972
(Continued)

OTHER PUBLICATIONS

International Search Report and Written Opinion received in Application Serial No. PCT/EP2019/050886 dated Jul. 25, 2019, 10 pgs.
(Continued)

*Primary Examiner* — Timothy J Thompson
*Assistant Examiner* — Michael F McAllister
(74) *Attorney, Agent, or Firm* — Michael A. Bondi; Moss & Barnett

(57) ABSTRACT

A configurable modular computer enclosure includes a plurality of outer enclosures (1, 2, 3), the outer enclosures being connected together in a depth stacked formation producing a single composite outer enclosure with a single internal volume and a depth equalling the combined depths of the outer enclosures. The composite outer enclosure houses multiple sets of configurable inner enclosures (4, 5, 6, 7, 8), each inner enclosure set being formed into a composite inner enclosure by connecting together the inner enclosures in the set, allowing unlimited configurations of composite inner enclosures. Each composite inner enclosure is inserted into the composite outer enclosure and aligned via guides or runners (9) integrated into the outer enclosures.

15 Claims, 10 Drawing Sheets

Figure 1:
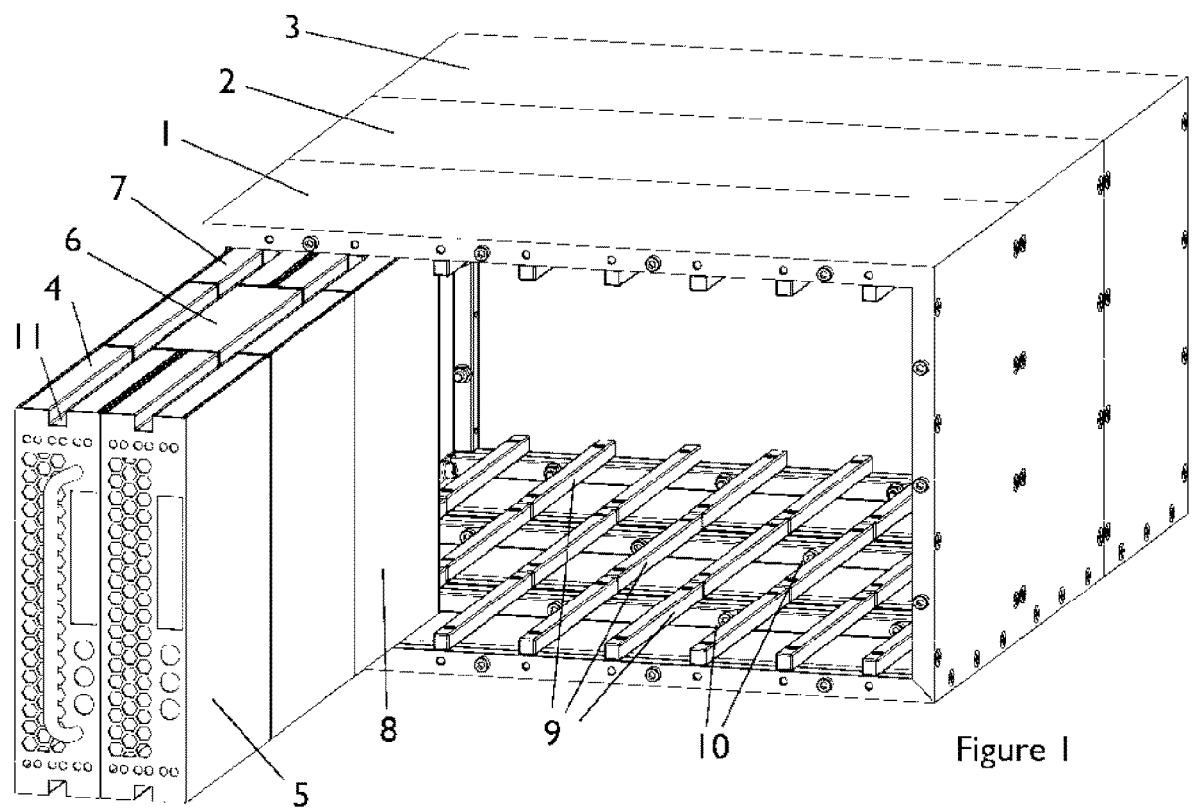

(58) Field of Classification Search
USPC .......................................................... 174/520
See application file for complete search history.

(56) References Cited

U.S. PATENT DOCUMENTS

| | | | | |
|---|---|---|---|---|
| 7,646,609 | B2* | 1/2010 | Corrado | G06F 1/181 |
| | | | | 361/740 |
| 7,710,715 | B2* | 5/2010 | Furey | G06F 1/181 |
| | | | | 361/679.02 |
| 9,851,764 | B2* | 12/2017 | Harvilchuck | G06F 1/185 |
| 2007/0233781 | A1 | 10/2007 | Starr | |
| 2008/0164794 | A1 | 7/2008 | Lai | |
| 2009/0140617 | A1* | 6/2009 | Barringer | G06F 1/183 |
| | | | | 312/223.2 |
| 2009/0273898 | A1 | 11/2009 | Imsand | |
| 2011/0317351 | A1* | 12/2011 | Pizzolato | G06F 1/20 |
| | | | | 361/679.4 |
| 2013/0319961 | A1 | 12/2013 | Sun | |
| 2014/0085802 | A1* | 3/2014 | Ning | G06F 1/183 |
| | | | | 361/679.31 |
| 2014/0334084 | A1* | 11/2014 | Fricker | G06F 1/183 |
| | | | | 361/679.4 |
| 2016/0057886 | A1 | 2/2016 | Harvilchuck | |

FOREIGN PATENT DOCUMENTS

| | | |
|---|---|---|
| DE | 4307208 C1 | 5/1994 |
| WO | 199741500 A1 | 11/1997 |

OTHER PUBLICATIONS

United Kingdom Search Report received in Application Serial No. GB1800665.0 dated Jul. 10, 2019, 5 pgs.

* cited by examiner

CONFIGURABLE MODULAR COMPUTER ENCLOSURE

BACKGROUND OF THE INVENTION

Field of the Invention

The present invention relates to computer enclosures which contain multiple inner enclosures such as compute node enclosures and storage node enclosures, the set of node enclosures being enclosed in an outer enclosure.

Related Art

The increasing use of multiple micro-computer systems in place of monolithic mainframe computers has led to the development of computer enclosures which house multiple computer nodes at high density. Each node in such a system typically contains a computer motherboard and/or a set of storage drives. The common terminology for such nodes is the "blade node" and the outer cabinet a "blade enclosure".

Current blade systems typically provide a blade enclosure which contains a common connection point mid-way back (the "mid-plane") or at the back (the "back-plane") of the enclosure. Each blade node connects to this common connection point in order to access shared resources such as an electric power supply and computer network connectivity. For mid-plane based blade systems, the rear of the blade enclosure behind the mid-plane houses hardware components which support the shared resources. These include power supply units and network switches.

The current state of art of blade systems is the provision of a single, fixed dimensioned outer blade enclosure with integrated shared resource hardware in the rear section and a fixed volume in the front section to house multiple blade nodes. Blade nodes of a single fixed depth may be inserted into the front of the outer enclosure. This setup allows different width and height blade nodes to be inserted, but limits the configurability of the blade system to that of groups of nodes of identical depths, the depth equalling the depth of the fixed dimensioned outer blade enclosure. In addition, the investment necessary to procure the single large blade enclosure is often prohibitive when a smaller number of compute and storage nodes is initially required.

As a result, it is very difficult to adapt current blade systems for diverse configurations and requirements such as size, performance, cost, functionality of the blade system, future expansion, and reconfiguration. Current monolithic blade systems may not easily be extended, contracted, split into multiple smaller blade systems, or intricately reconfigured from their primary design or use case.

SUMMARY

In order to overcome the present limitations with blade enclosures, the present invention provides a fully configurable modular blade enclosure, allowing the end user the capability to create diverse and varied blade node enclosure arrangements with the same set of core modular enclosure components. This includes configurability for different outer enclosure depths via depth stacking of outer enclosures, and configurability of composite inner enclosures via depth, width, and optionally height stacking of node enclosures to form composite blade node sets. The depths of the outer enclosures in a composite outer enclosure may be different to each other and are not related to each other, nor to the node enclosures to be placed within the composite outer enclosure.

Depth stacking of outer enclosures allows configurability of all dimensions of the blade node sets inserted into the resulting composite outer enclosure. The depth dimension of the outer and inner enclosures is special in so far as blade enclosures are normally mounted inside 19" rack equipment. As such, insertion of blade nodes into a blade enclosure must be performed from the front or back of the blade enclosure. Provision for full configurability of the arrangement of inner enclosures as provided by the present invention allows a far greater range of uses than is currently possible with the related art.

The present invention is primary concerned with the physical assemblies of the outer and inner enclosures, the content of each inner blade node, consisting of equipment including motherboards and storage drives, being unconstrained.

In one embodiment, an outer blade enclosure, possessing a plurality of horizontal alignment bolt holes located within the front and rear edges of the outer enclosure and which lie inline with the depth axis, may be attached together via alignment bolts to a second outer enclosure of equal width and height, to form a single depth stacked composite outer enclosure with a depth equal to the combined depths of the two outer enclosures. Generalising, a plurality of outer enclosures of equal width and height and equipped with such horizontal alignment bolt holes may be attached together to form a single depth stacked composite outer enclosure with a depth equal to the combined depths of the outer enclosures.

A node enclosure is defined here as an indivisible inner enclosure which contains unspecified computer hardware. A blade node set is defined as a set of node enclosures, physically arranged together to form a single composite "blade node", possessing uniform width and uniform depth. A plurality of blade node sets are inserted into the composite outer lade enclosure, forming a complete system.

Given the composite outer enclosure with depth equal to the combined depths of the individual outer enclosures, a plurality of blade node sets may then be configured with various physical arrangements for the available volume within the composite outer enclosure. The overall depth of each of these blade node sets will not exceed the depth available inside the composite outer enclosure. Similarly, the sum of the widths of the blade node sets to be inserted into the composite outer enclosure will not exceed the available width inside the composite outer enclosure.

With respect to the depth axis, each blade node set consists of one or more conceptual node segments. Each segment consists of one or more full or partial node enclosures stacked widthwise and fixed together in this embodiment via horizontal alignment bolt holes located within the sides of the node enclosures and which lie inline with the width axis. The segment depth of a blade node set is defined as the smallest depth of all the node enclosures contained within the set. The depth of each node enclosure within the blade node set is thus equal to a multiple of the segment depth, and node enclosures span one or more segments.

Similarly and with respect to the width axis, each blade node set consists of one or more conceptual node slices. Each slice consists of one or more lull or partial node enclosures stacked depthwise and fixed together in this embodiment via horizontal alignment bolt holes located within the front/rear of the node enclosures and which lie inline with the depth axis. The slice width of a blade node set is defined as the smallest width of all the node enclosures contained within the set. The width of each node enclosure within the blade node set is thus equal to a multiple of the slice width, and node enclosures span one or more slices.

The overall physical constrains within a particular blade node set are that the set of node enclosures contained within the blade node set must fit together without forming voids and that the overall shape of the blade node set must form a rectangular cuboid. The exact arrangement of the node enclosures within each blade node set is thus configurable and is determined for each use case, despite the blade node sets being constructed from a small number of node enclosure models of different dimensions.

Each resulting blade node set will have a uniform depth not exceeding the depth of the volume within the composite outer enclosure. Each resulting blade node set will have a uniform width. Including engineered gaps for manufacturing tolerances, the combined widths of all the resulting blade node sets inserted within the composite outer enclosure will not exceed the width of the volume within the composite outer enclosure. A group of blade node sets with a combined width (including tolerances) which is equal to the inner width of the composite outer enclosure will thus fill the outer composite enclosure width exactly.

With regard to the height of the blade node sets and the heights of the node enclosures contained within, it is trivial to extend the modularity concept to this third dimension. In such a configuration, a third conceptual measurement representing the smallest indivisible height of a node enclosure would exist, in addition to the segment depth and the slice width. Node enclosures would then also be aligned and fixed together in the height dimension, in addition to the depth and width dimensions.

With regard to the form of the node enclosures, the form of the node enclosures as described in the example embodiment above is rectangular cuboid. Without loss of scope of the invention, the form of the cross sectional profiles of the node enclosures in each dimension could be different via a simple adaptation of the stacking embodiments.

Common uses of the present invention are varied and the content of each node enclosure may be compute nodes, storage node, power supply units, network switches, or any other hardware capable of being situated within a node enclosure. Other suitable uses for node enclosures include, but are not limited to, the housing of circuits for audio and other signal processing circuitry, mechanical systems for extractable keyboards and other mechanical devices, and patch-bays for cable connectivity.

DRAWINGS

Figure 2:
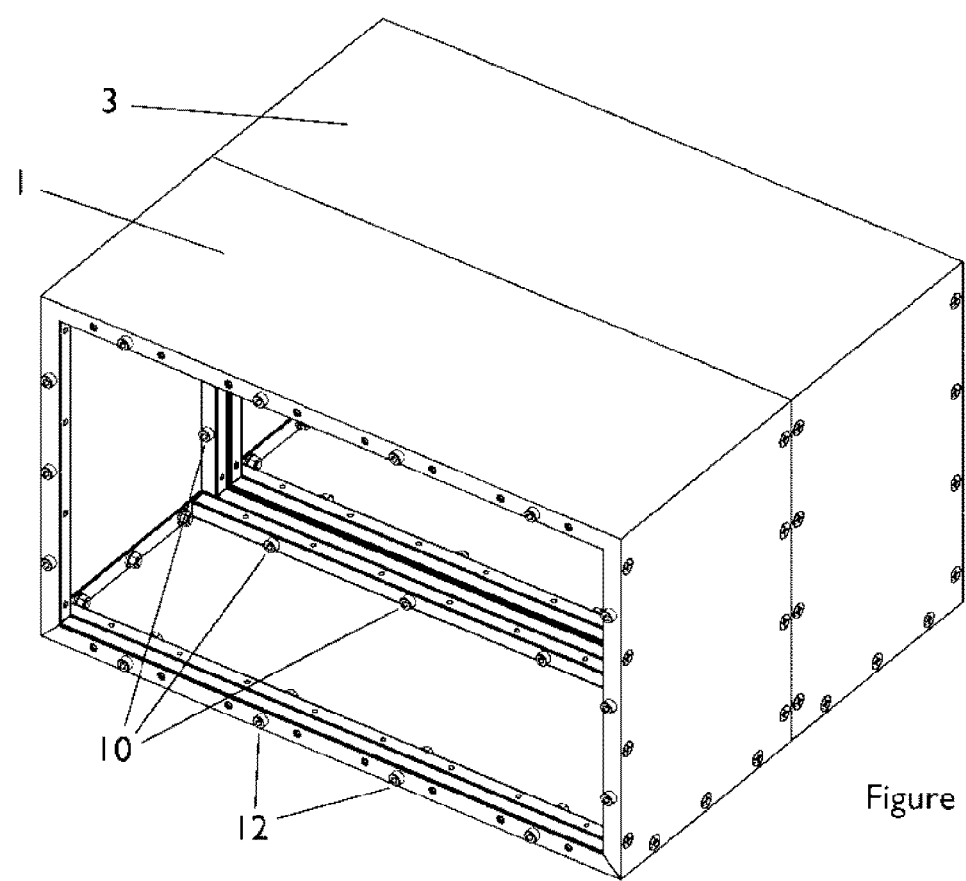
Figure 3:
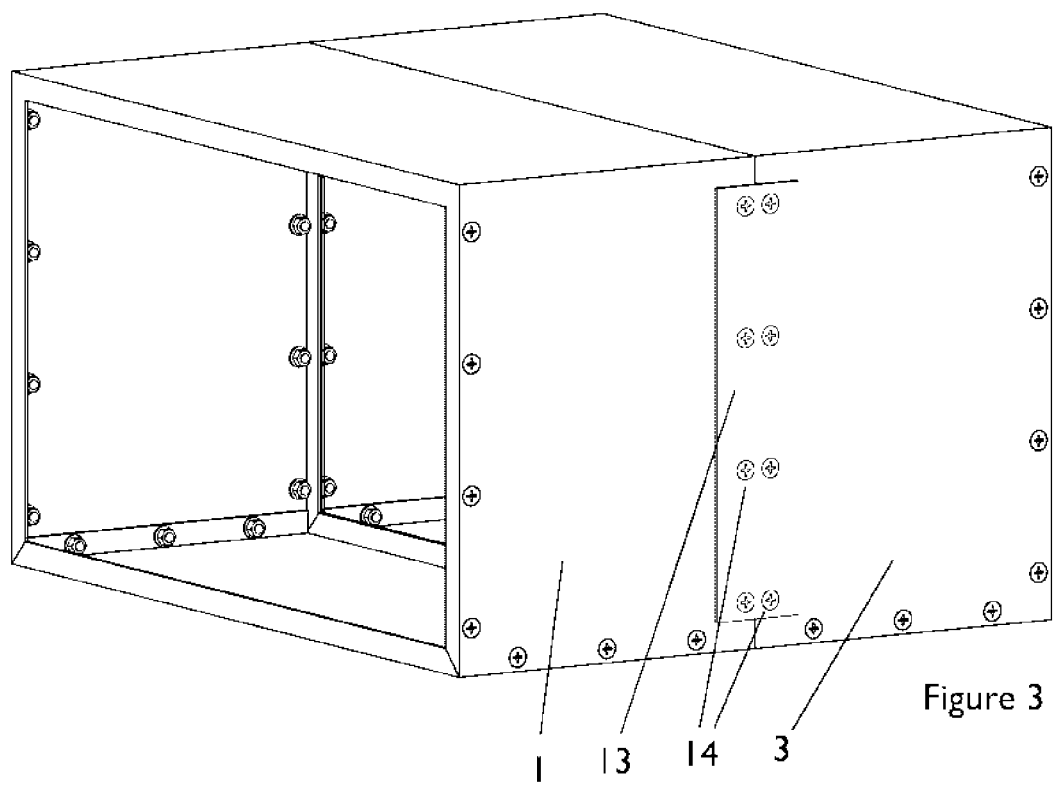
Figure 4:
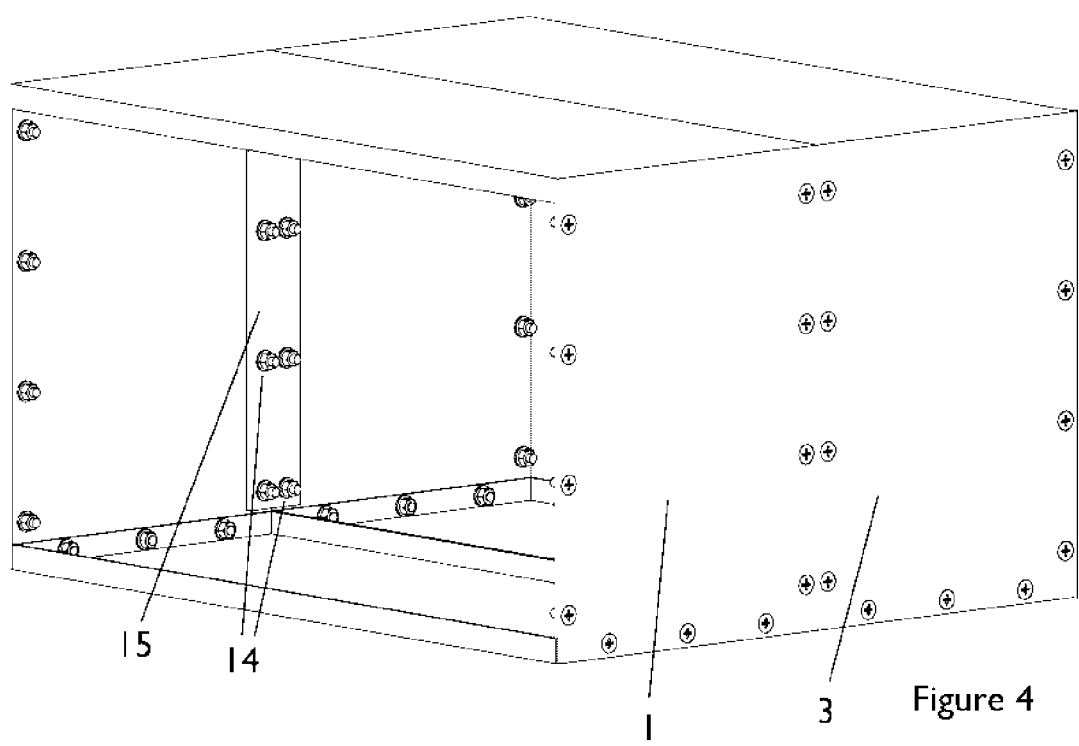
Figure 5:
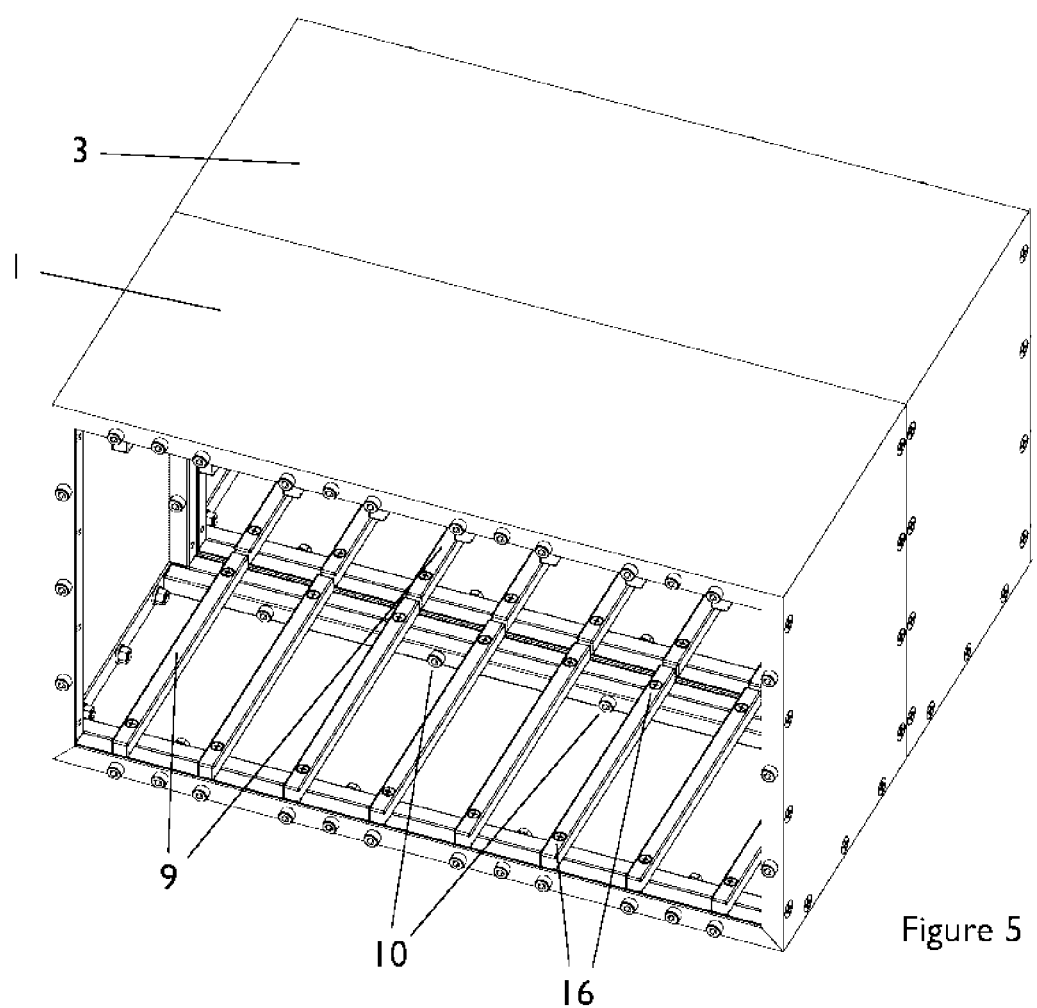
Figure 6:
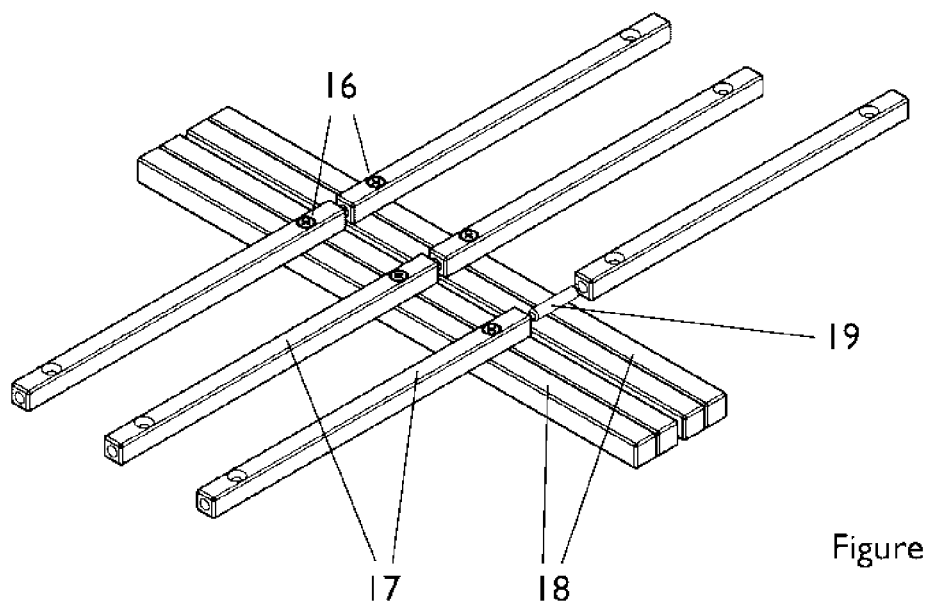
Figure 7:
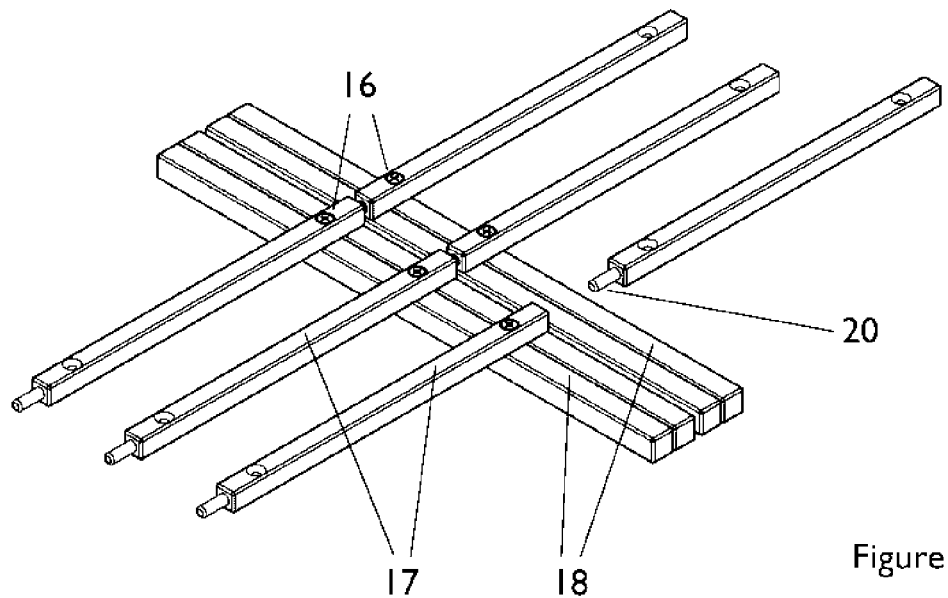
Figure 8:
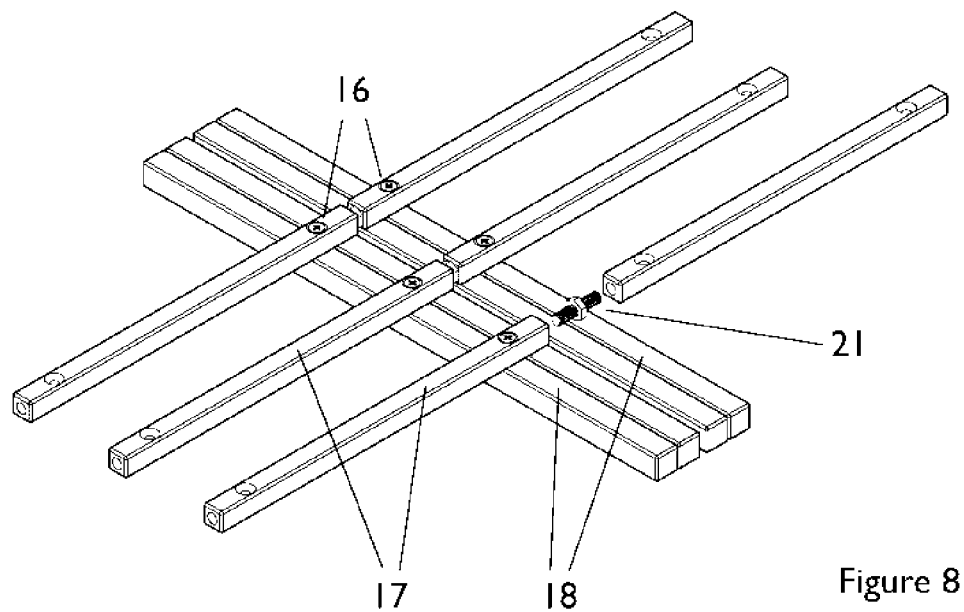
Figure 9:
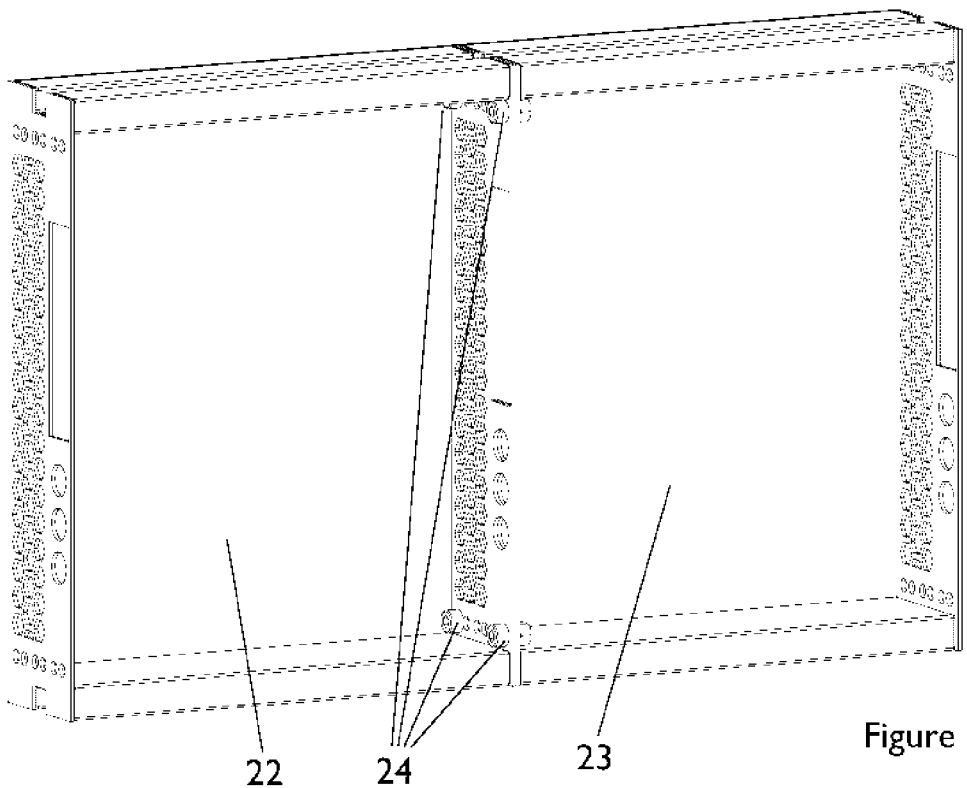
Figure 10:
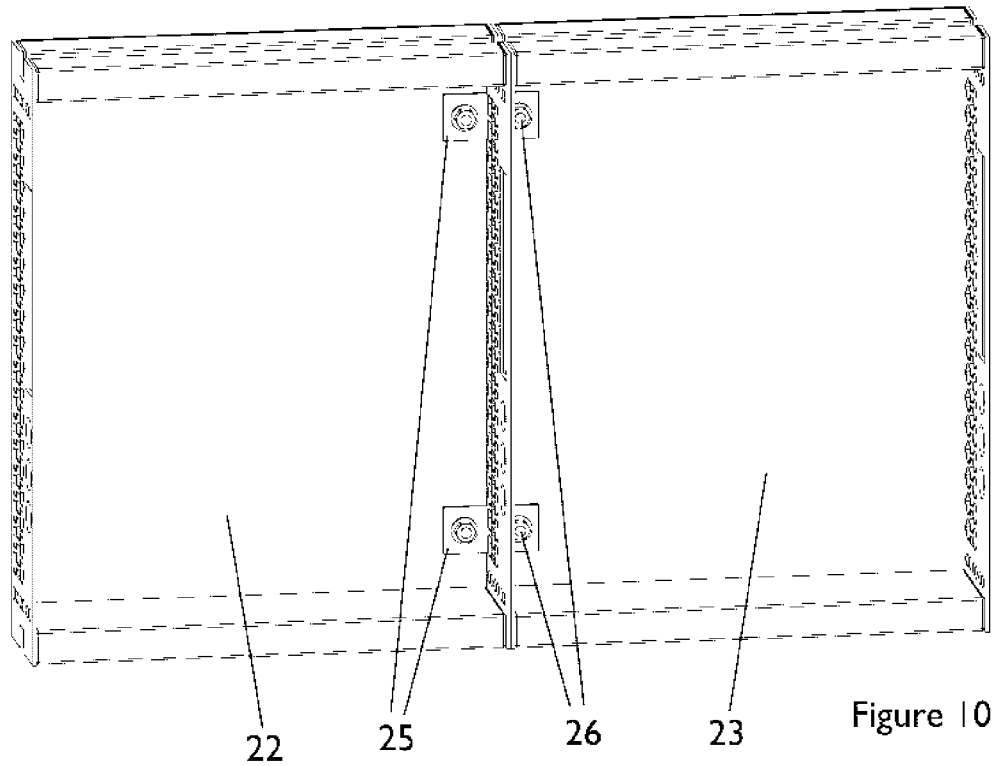
Figure 11:
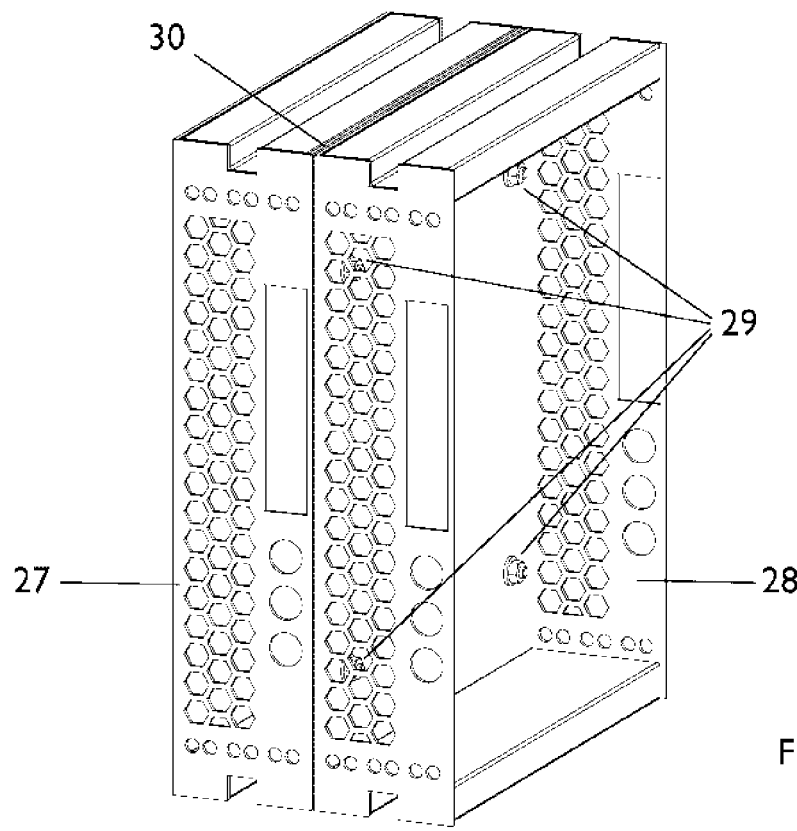
Figure 12:
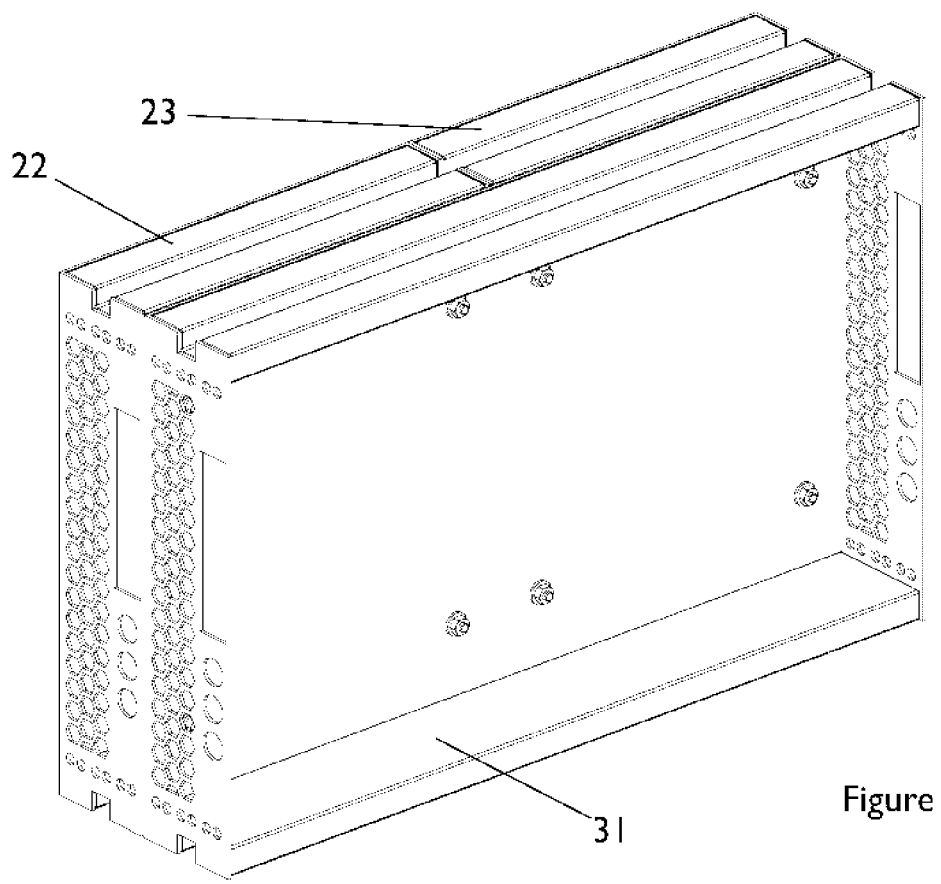

The invention will now be described solely by way of example and with reference to the accompanying drawings in which:

FIG. 1 shows an example configuration of one embodiment of a complete modular blade enclosure, consisting of three outer enclosures forming the composite outer enclosure and a single blade node set formed from four single-slice node enclosures and one double-slice node enclosure, FIG. 2 shows outer enclosure depth stacking with alignment tension bolts in the front/rear of the outer enclosures, FIG. 3 shows outer enclosure depth stacking with exterior side mounted alignment shear bolt fixings, FIG. 4 shows outer enclosure depth stacking with interior side mounted alignment shear bolt fixings, FIG. 5 shows indirect alignment of runner guides between depth stacked outer enclosures via the outer enclosure depth stack fixations, FIG. 6 shows direct alignment of runner guides via removable dowels between the runners, FIG. 7 shows direct alignment of runner guides via integrated dowels in one end of the runners, FIG. 8 shows direct alignment of runner guides via double ended left/right hand threaded bolts between the runners, FIG. 9 shows node enclosure depth stacking via alignment tension bolts in the front/rear of node enclosures, FIG. 10 shows node enclosure depth stacking via alignment shear bolt fixings in the sides of node enclosures, FIG. 11 shows node enclosure width stacking via alignment tension bolts in the sides of node enclosures, FIG. 12 shows an example of a double segment node enclosure within a blade node set.

Figure 13:
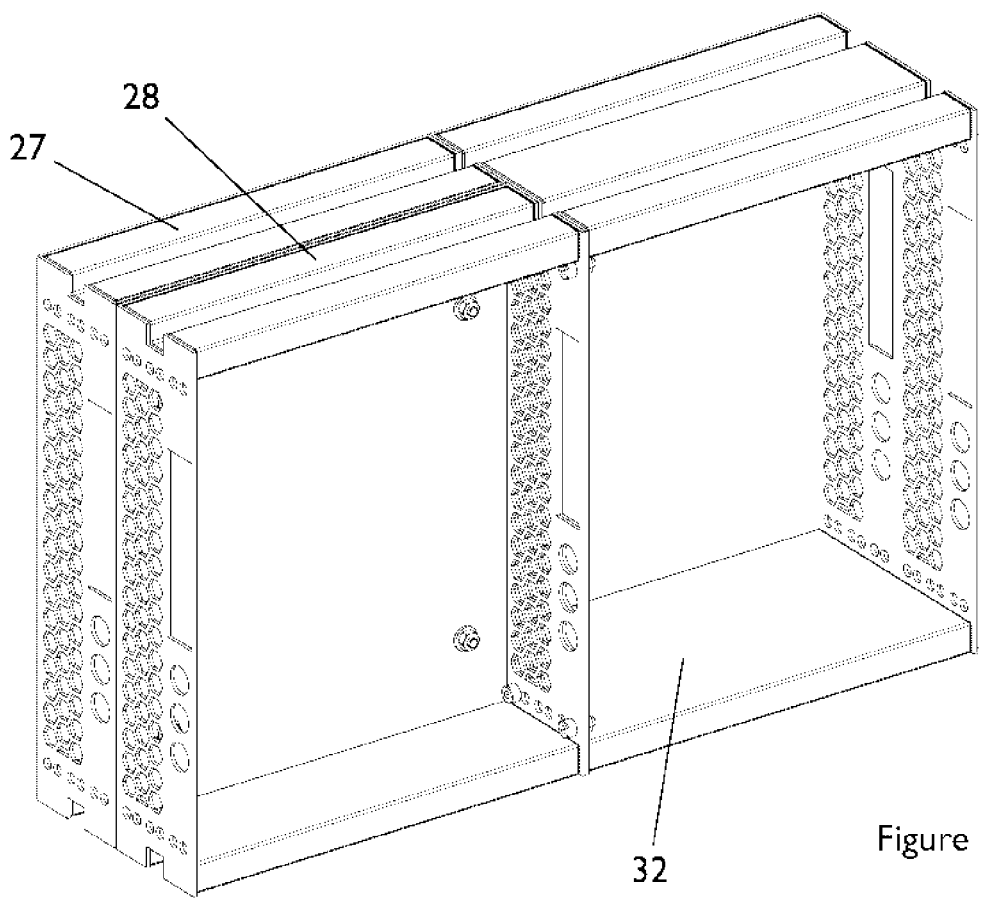
Figure 14:
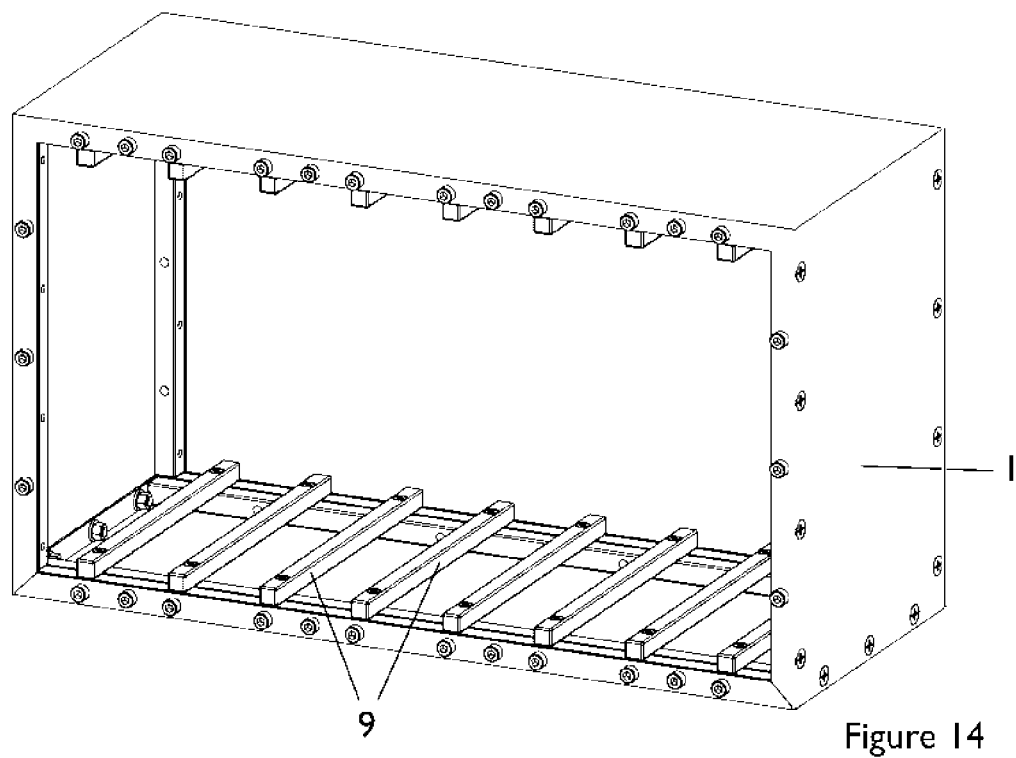
Figure 15:
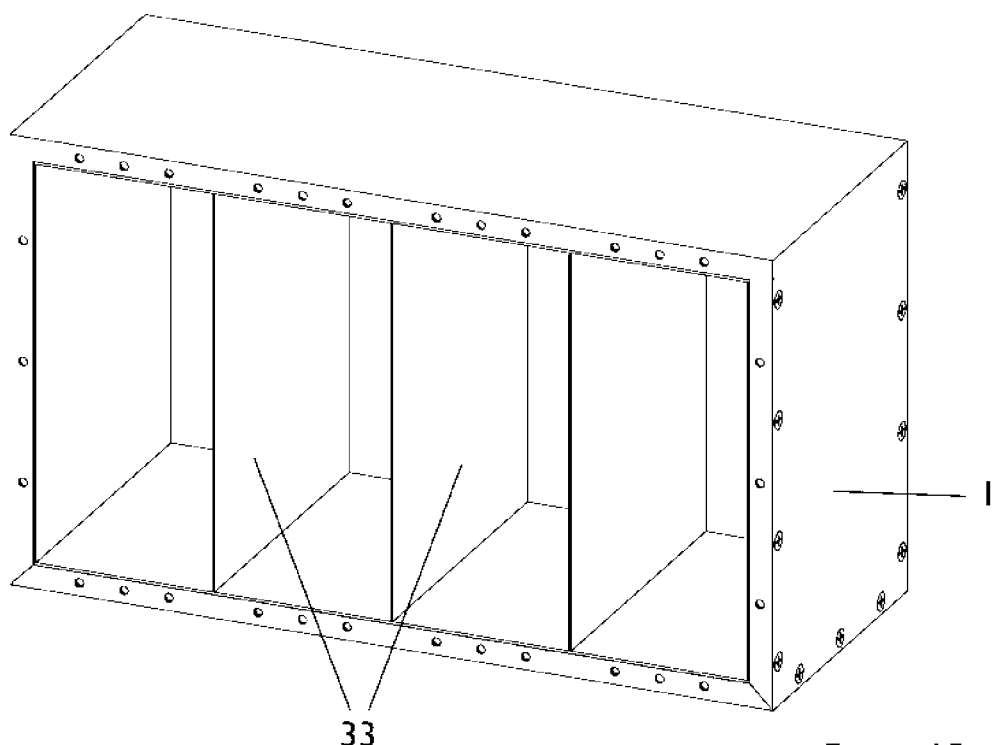
Figure 16:
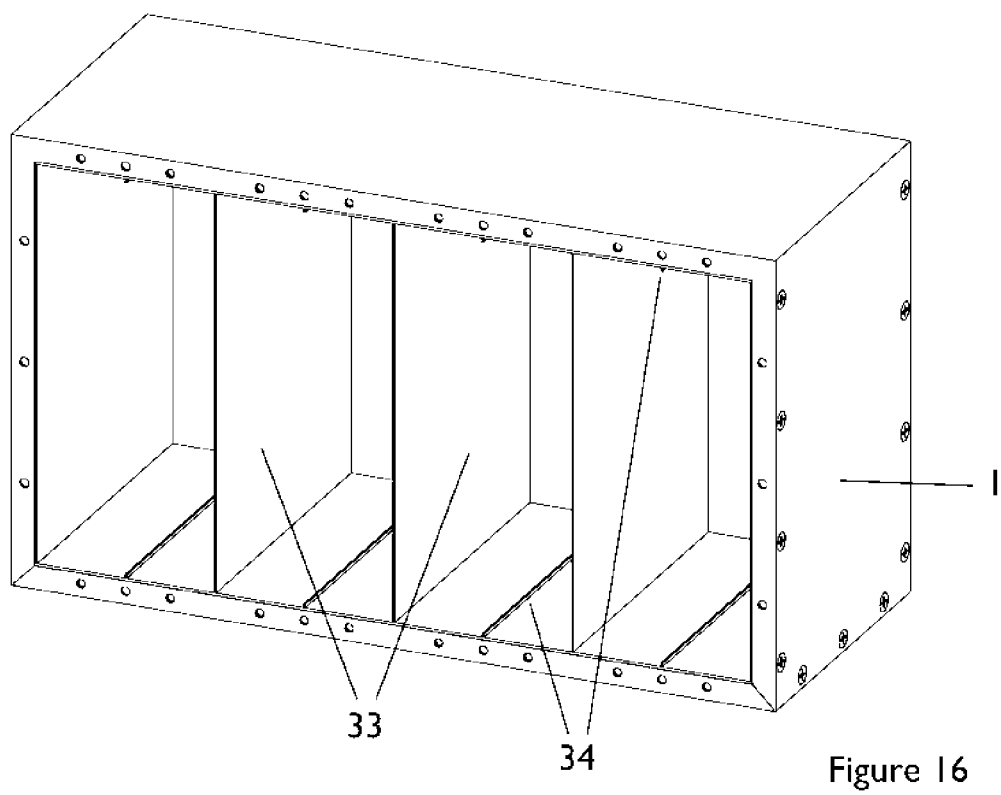
Figure 17:
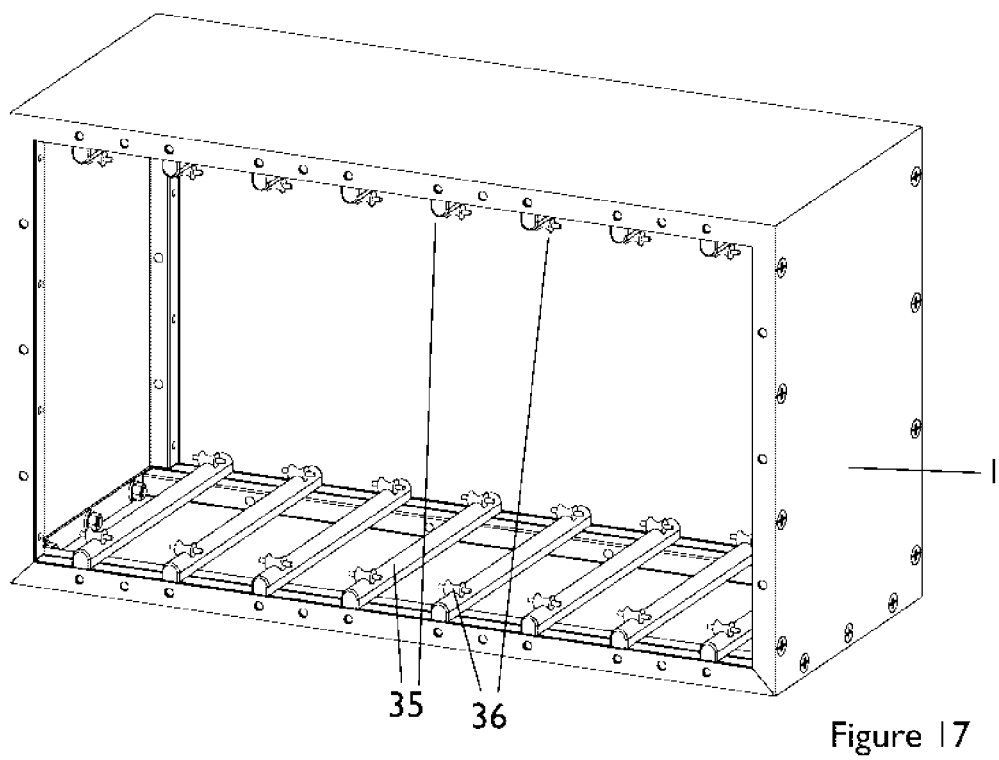
Figure 18:
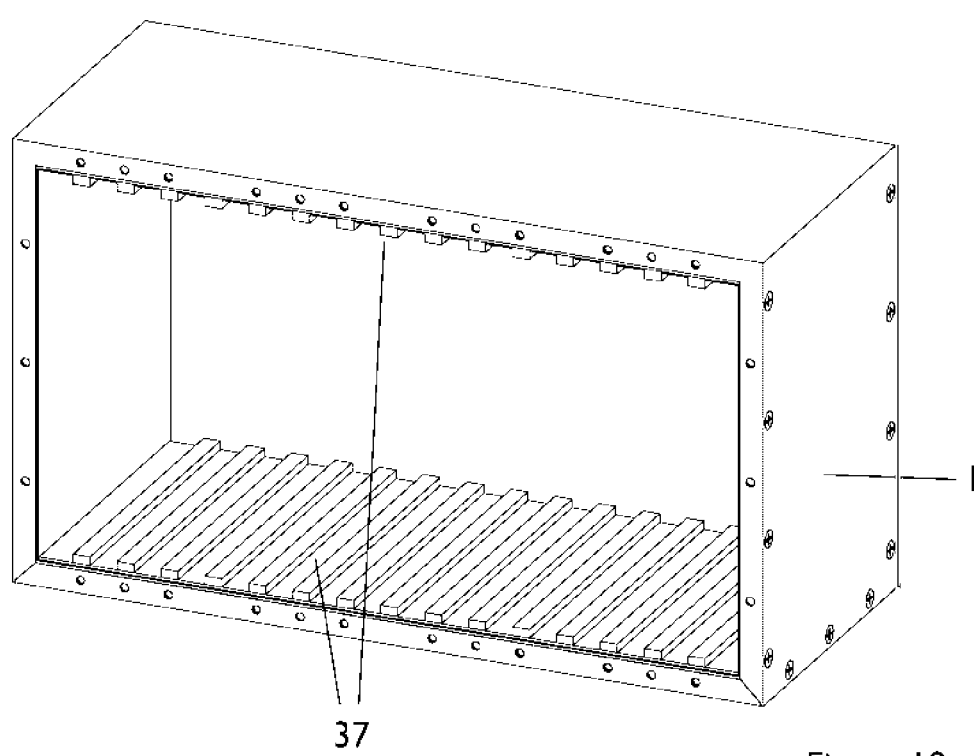
Figure 19:
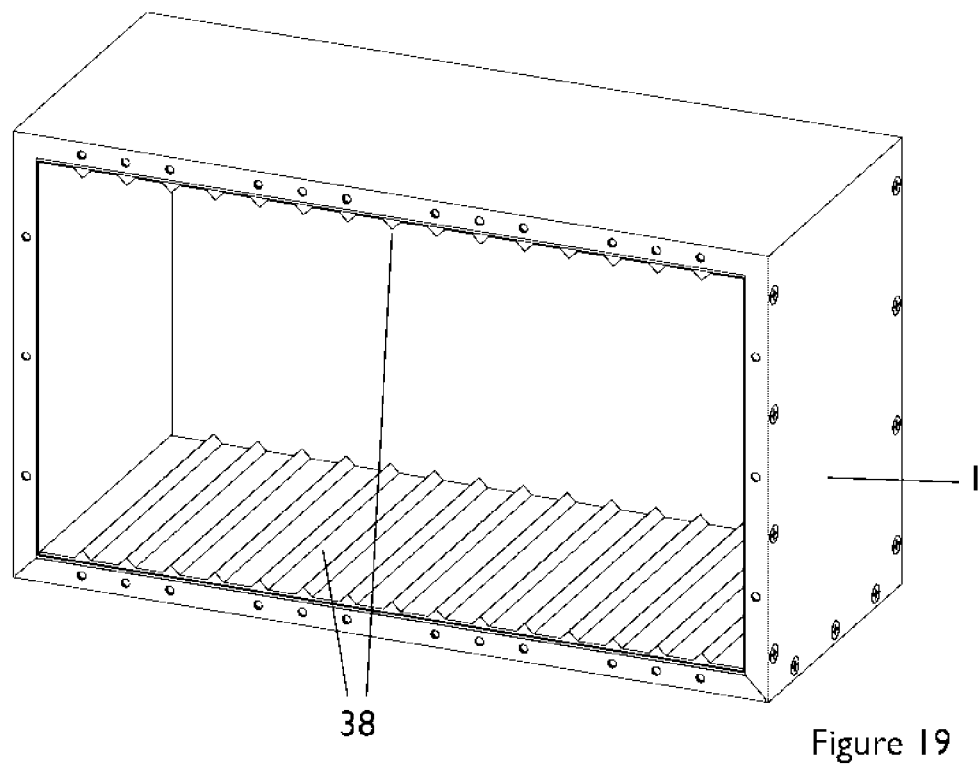
Figure 20:
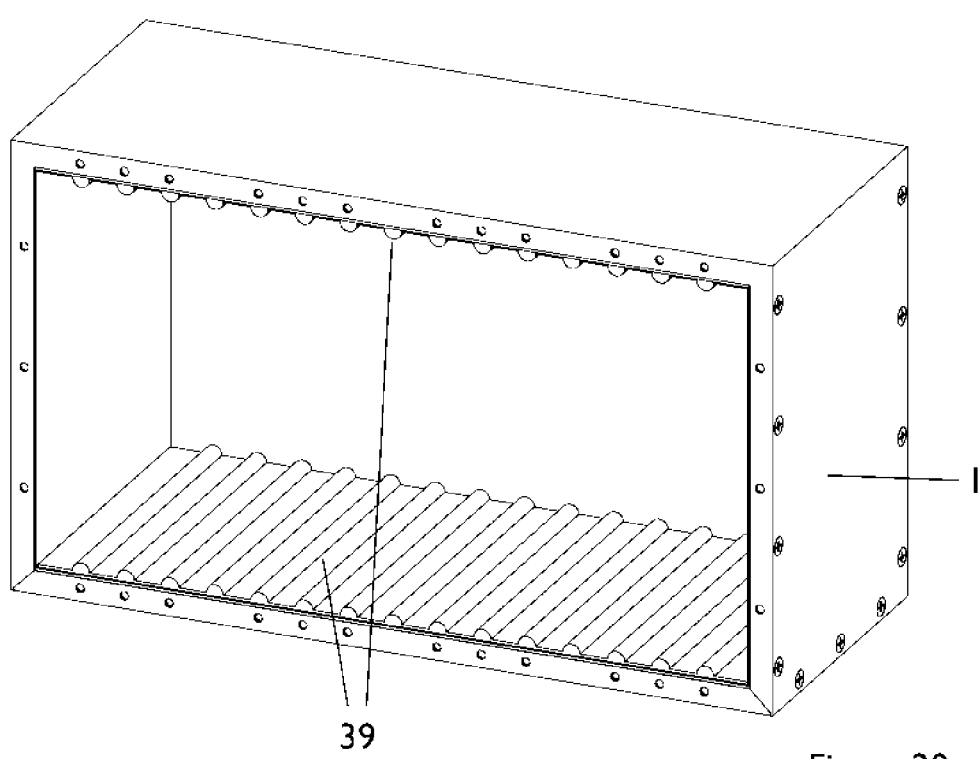

FIG. 13 shows an example of a double slice node enclosure within a blade node set, FIG. 14 shows a runner based depth stackable guide embodiment, FIG. 15 shows a wall based depth stackable guide embodiment, FIG. 16 shows a combination wall and mini-runner based depth stackable guide embodiment, FIG. 17 shows a runner and wheel based depth stackable guide embodiment, FIG. 18 shows a continuous undulating surface based depth stackable guide embodiment with square guides, FIG. 19 shows a continuous undulating surface based depth stackable guide embodiment with triangular guides, FIG. 20 shows a continuous undulating surface based depth stackable guide embodiment with semi-circular guides.

DETAILED DESCRIPTION

FIG. 1 illustrates a configured example of a particular embodiment. The configurable modular computer enclosure example includes a set of outer enclosures 1, 2, 3 depth stacked and fixed together by tension bolts 10 to form a single composite outer enclosure.

A collection of blade node sets are inserted into the composite outer enclosure. Shown in FIG. 1 is a single example of a blade node set, this configured example consisting of five node enclosures 4, 5, 6, 7, 8. Single slice node enclosures 4 and 5 are width stacked to form a single segment at the front of the blade node set. Double slice node enclosure 6 forms the middle segment of the blade node set. Single slice node enclosures 7 and 8 are width stacked to form a single segment at the rear of the blade node set.

The blade node set illustrated in FIG. 1 has three segments. Any combination of outer enclosure depths may be used to house the example blade node set, independently to the individual segment depths within the blade node set. Any combination of segment depths may be used in each blade node set in an enclosure. The only constraint is that the total depth of a particular blade node set must not exceed the available depth of the composite outer enclosure into which the blade node set will be introduced.

The outer enclosures 1, 2, 3 of this embodiment each contain a set of runner guides 9 which align the insertion of the blade node sets into the full depth of the composite outer enclosure. In this embodiment, the runner guides 9 are themselves indirectly aligned between each outer enclosure via the depth stack alignment bolts 10. The node enclosures of this embodiment have corresponding U shaped channels 11 into which the runner guides enter when the blade node set is inserted into the composite outer enclosure.

FIG. 2 shows the details of the depth stacking and alignment tension bolts 10 between two outer enclosures 1, 3. In this embodiment, the outer enclosures have depth stack alignment bolt holes in the front and rear of the outer enclosures through which the tension bolts 10 are fed. The outer enclosures are aligned and fixed securely to each other. The front of the front outer enclosure and the rear of the rear outer enclosure have unused depth stack/alignment tension bolts 12, ready for use for additional depth stacking if required.

FIG. 3 shows another embodiment of the depth stacked outer enclosures 1, 3 in which the fixation and alignment of the outer enclosures is achieved via exterior side alignment shear bolt fixing plates 13. The exterior fixing plates create a horizontal alignment of depth stacked outer enclosures themselves. Vertical alignment is achieved via the shear bolts 14 positioned on the sides of the outer enclosure.

FIG. 4 shows another embodiment of the depth stacked outer enclosures 1, 3 in which the fixation and alignment of the outer enclosures is achieved via interior side alignment shear bolt fixing plates 15. The interior fixing plates create a horizontal alignment of depth stacked outer enclosures themselves. Vertical alignment is achieved via the shear bolts 14 positioned on the sides of the outer enclosure.

FIG. 5 shows a blade node set guide embodiment installed within depth stacked outer enclosures. Runner guides 9 are aligned between depth stacked enclosures 1, 3 via indirect alignment tension bolts 10 and runner alignment tension bolts 16. A group of inline runners (one from each of the depth stacked outer enclosures) form a composite single runner which spans the depth of the composite outer enclosure. The set of composite runners form the complete set of guides for the configured composite outer enclosure.

FIG. 6 shows a variation of the runner guide embodiment which includes directly aligned runners 17, the alignment being achieved via dowels 19. The dowels may be composed of any uniform profile. Shown in FIG. 6 are dowels with a circular profile. Also shown in FIG. 6 are example outer enclosure runner bases 18, to which the runner guides are attached via tension bolts 16. The ends of the runner guides of this embodiment have holes which accept dowels of a compatible diameter. Runner guides positioned inline across the depth stacked outer enclosures thus interconnect with each other and align via the dowels. In place of bolts, the runner guides could be attached to the bases via other means such as welding joints or glue.

FIG. 7 shows a variation of the directly aligned runner guide embodiment which integrates the dowel 20 into the end of the runner guides 17. In this embodiment, the front end of the runner guides have integrated dowels 20 and the rear ends of the runner guides have holes which accept the dowel. Runner guides positioned inline across the depth stacked outer enclosures will thus interconnect with each other. The integrated dowels may be composed of any uniform profile. Shown in FIG. 7 are integrated dowels with a circular profile.

FIG. 8 shows a variation of the directly aligned runner guide embodiment which uses double ended left-right hand thread bolts 21 to connect the runners 17 together. In this embodiment, the front end of the runner has a right hand threaded hole which accepts the right hand thread of bolt 21 and the rear end of the runner has a left hand threaded hole which accepts the left hand thread of bolt 21. Runner guides positioned inline across the depth stacked outer enclosures will thus interconnect with each other and align via the double ended left-right hand thread bolts. The heads of the double ended bolts must have an overall radius that is less than the smallest cross-sectional radius of the runner guide, otherwise the bolt heads will prevent insertion of the blade node sets past the front outer enclosure.

FIG. 9 shows an example of node enclosure depth stacking. In this embodiment, two node enclosures 22, 23 are depth stacked via alignment tension bolts 24 in the front and rear of the node enclosures. The embodiment of FIG. 9 also illustrates dual use of precut holes in the front and rear of the node enclosures for node enclosure depth stacking with tension bolts. The holes used by the tension bolts are available for use for mounting electronic components such as LEDs or switches if required in the front of the front node enclosure and/or in the rear of the rear node enclosure in the blade node set slice.

Whilst the node enclosure depth stacking embodiment in FIG. 9 illustrates tension bolt fixation, the embodiment shown in FIG. 10 illustrates node enclosure depth stacking via shear bolt fixings. The node enclosures 22, 23 are aligned via alignment plates 25, placed along the sides of the node enclosures. Shear bolts 26 are used to fix the alignment plates to the node enclosures. Countersunk bolt heads or an indented node enclosure must be used in order to ensure there is no encroachment outside of the walls of the node enclosures.

The embodiment in FIG. 10 illustrates shear plates placed on the interior of the side walls of the node enclosures. Another embodiment would be to place the shear plates on the exterior of the side walls of the node enclosures. Whilst this embodiment would achieve the same alignment and fixing of the node enclosures, the fixing plates would encroach on the interior volume of the composite outer enclosure. Specific provision would thus be necessary to avoid adjacent blade node sets from interfering with each other when inserted into the interior volume of the composite outer enclosure. One suitable provision for such an embodiment would be an adapted node enclosure containing a depressed region into which the fixing plates could fit flush with the exterior of the node enclosure side walls.

FIG. 11 shows an embodiment of width stacking of node enclosures within a blade node set. Node enclosures 27, 28 form two slices of a blade node set and are aligned and fixed together via tension bolts 29 which pass through aligned holes in the sides of the node enclosures. Width stacking spacers 30 are required to fill the tolerance gap normally present between adjacent but unconnected node enclosures. In addition to tension bolt width stacking as illustrated in FIG. 11, shear bolt width stacking similar to the shear bolt depth stacking as illustrated in FIG. 10 is also possible. Similarly to the exterior shear fixing depth stacking embodiment illustrated in FIG. 10, provision would be required, such as depressed regions in the ends of the node enclosures, in order to house the fixing plates.

FIGS. 12 and 13 illustrate node enclosures that span more than one segment or slice. FIG. 12 shows two single slice, single segment node enclosures 22, 23 depth stacked as previously illustrated in FIGS. 9 and 10. Contained within the same blade node set, FIG. 12 illustrates a width stacked node enclosure 31 possessing a depth equal to two segments. The width stacking embodiment used in FIG. 12 is the same as the embodiment described in FIG. 11.

Similarly but with respect to slices, FIG. 13 shows two single slice, single segment node enclosures 27, 28 width stacked as previously seen in FIG. 11. In the same node set, FIG. 13 illustrates a depth stacked node enclosure 32 possessing a width equal to two slices. The depth stacking embodiment used in FIG. 12 is the same as the embodiment described in FIG. 9.

FIGS. 14 to 20 illustrate a variety of different embodiments for node blade set guides. These align the blade node sets when inserted into the composite outer enclosure. Each of the guide embodiments maintain the alignment between adjacent depth stacked outer enclosures. In each of the figures, a single outer enclosure is shown for brevity. Other embodiments which fall into the scope of the appended claims may also be implemented equally to the example embodiments illustrated in FIGS. 14 to 20. The fundamental requirement for such guide embodiments is that an embodiment must be able to be depth stacked without causing obstructions which would prevent the full insertion of the blade node sets.

Five of the example node blade set guide embodiments (shown in FIGS. 14, 17, 18, 19, and 20) are equal in functionality and allow full and unlimited configuration of the blade node sets to be inserted into the internal volume of the composite outer enclosure. The other two example node blade set guide embodiments (shown in FIGS. 15 and 16) provide a reduced functionality due to the physical division of the internal volume of the composite outer enclosure.

FIG. 14 shows a node blade set guide embodiment which uses runner guides. The runner guides 9 are equally spaced across the bottom of the internal volume of the outer enclosure 1, inline with the depth axis. A second set of runner guides are equally spaced across the top of the internal volume of the outer enclosure. The corresponding node enclosures (not shown in FIG. 14) contain U shaped channels which run along the guides. Shown in FIG. 14 are runner guides with a square cross-sectional profile. Other cross-sectional profiles may also be used, without changing the fundamental design. When a different cross-sectional profile is used for the runner guides, the U shaped channels in the corresponding node enclosures must match the different cross-sectional profile.

FIGS. 15 and 16 show embodiments of fully and partially implicit guides. FIG. 15 shows the internal volume of outer enclosure 1 divided into a number of sections by internal walls 33. These walls reduce the available width to a fraction of the full internal width of the outer enclosure. One or more blade node sets whose combined width is equal to the available width between walls may be inserted together into the available width. FIG. 16 shows the same internal volume division as illustrated in FIG. 15, with the addition of supplementary mini-runners 34 placed inline with the depth axis. These mini-runners provide some additional restriction in lateral movement when inserting the blade node sets.

FIG. 17 shows a node blade set guide embodiment which uses semi-circular runner guides with guide wheels. The semi-circular runner guides 35 are equally spaced across the bottom of the internal volume of the outer enclosure 1, inline with the depth axis. A second set of semi-circular runner guides are inverted and equally spaced across the top of the internal volume of the outer enclosure 1. The node enclosures (not shown in FIG. 17) contain runner wheels 36 in place of the U shaped channels previously illustrated in FIG. 1. Shown in FIG. 17 are runner guides with a semi-circular cross-sectional profile. Other cross-sectional profiles may also be used, without changing the fundamental design. When a different cross-sectional profile is used for the runner guides, the profiles of the runner wheels in the corresponding node enclosures must match the different cross-sectional profile of the runners.

FIGS. 18, 19 and 20 show embodiments of continuous undulating surface based guides. In these three embodiments, the guides are constructed as a pair of continuous pieces of material 37, 38, 39. One piece is placed at the bottom of the outer enclosure and the other piece is inverted and placed at the top of the outer enclosure.

FIG. 18 illustrates a one piece guide construction using a square guide shape 37. FIG. 19 illustrates a one piece guide construction using a triangular guide shape 38. FIG. 20 illustrates a one piece guide construction using a semi-circular guide shape 39. The corresponding node enclosures (not shown in FIGS. 18, 19 and 20) contain the inverse continuous undulating surface on the top and bottom of the nodes, which matches the undulating surface contained within the outer enclosures.

The one piece construction of the continuous undulating surfaces of the guide embodiments illustrated in FIGS. 18, 19 and 20 may be assembled from multiple sections of the surface. An approach of this type would facilitate the manufacture of the surface by extrusion. A single extrusion die of manageable dimensions could then be used to manufacture the entire surface in parts.

The various outer and inner enclosures of the embodiments may be constructed from any material that may be formed into sheets with a strength sufficient to prevent deformation of the walls of the enclosures when under stresses within design tolerances. The present invention does not stipulate any particular material. Without limitation, two suitable choices include steel and aluminium. These materials also provide earthing and electromagnetic shielding capabilities, which are beneficial to a system which houses electrical and electronic components. Other suitable materials may nevertheless be used for the construction of the enclosures.

Although the present invention has been described with respect to specific embodiments, it is understood, however, that the present invention encompasses various modifications, interpretations, and alternatives that may be suggested which fall into the scope of the appended claims.

The invention claimed is:

1. A configurable, modular, extensible computer enclosure system, comprising:
  (a) one or a plurality of outer enclosures of equal cross-sectional shape, of equal or varying depths, with open or openable fronts and backs, and with outer enclosure fixation points in or near the fronts and backs, allowing said outer enclosures to be fixed together to form a depth stacked composite outer enclosure;
  (b) a plurality of guide rails oriented in a front to back direction and integrated into said outer enclosures, said guide rails being aligned to form a plurality of composite guide rails when said outer enclosures are depth stacked to form said composite outer enclosure;
  (c) a plurality of inner enclosures of varying dimensions and with inner enclosure fixation points on a plurality of inner enclosure walls, allowing combinations of compatibly dimensioned inner enclosures to be fixed together to form a plurality of composite inner enclosures; and
  (d) a plurality of guide rail slots oriented in a front to back direction and integrated into said inner enclosures, said guide rail slots being aligned to form a plurality of composite guide rail slots when said inner enclosures are combined together to form said composite inner enclosures;
  whereby the resulting group of said composite inner enclosures, when placed together and having a combined cross-sectional shape that fits into the cross-sectional shape of said composite outer enclosure, are thereby able to be guided into said composite outer enclosure via said composite guide rails.

2. The configurable, modular, extensible computer enclosure system of claim 1 wherein said outer enclosures have a rectangular cross-sectional shape.

3. The configurable, modular, extensible computer enclosure system of claim 1 wherein said inner enclosures have a rectangular cross-sectional shape.

4. The configurable, modular, extensible computer enclosure system of claim 1 wherein said outer enclosure fixation points are tension based fixings in the front and rear of said outer enclosures.

5. The configurable, modular, extensible computer enclosure system of claim 1 wherein said outer enclosure fixation points are exterior mounted alignment shear fixings attached to the front and rear of the sides or top and bottom of said outer enclosures.

6. The configurable, modular, extensible computer enclosure system of claim 1 wherein said outer enclosure fixation points are interior mounted alignment shear fixings attached to the front and rear of the sides or top and bottom of said outer enclosures.

7. The configurable, modular, extensible computer enclosure system of claim 1 wherein said guide rails are distinct lengths of bar attached to the inner surfaces of said outer enclosures.

8. The configurable, modular, extensible computer enclosure system of claim 1 wherein said guide rail slots are wheeled runners attached to said inner enclosures.

9. The configurable, modular, extensible computer enclosure system of claim 1 wherein said guide rails are formed via continuous undulating surfaces on the inner surfaces of said outer enclosures.

10. The configurable, modular, extensible computer enclosure system of claim 1 wherein said guide rail slots are formed via continuous undulating surfaces on the outer surfaces of said inner enclosures.

11. The configurable, modular, extensible computer enclosure system of claim 1 wherein said guide rails are implicitly defined guide rails defined by the inner surfaces of said outer enclosures, and said guide rail slots are implicitly defined guide rail slots defined by the outer surfaces of said inner enclosures.

12. The configurable, modular, extensible computer enclosure system of claim 1 wherein said guide rails are indirectly aligned via the alignment of said outer enclosures resulting from the fixing together of said outer enclosures.

13. The configurable, modular, extensible computer enclosure system of claim 1 wherein said guide rails are aligned via dowels in the ends of said guide rails.

14. The configurable, modular, extensible computer enclosure system of claim 1 wherein said guide rails are aligned via double ended left/right hand threaded bolts screwed into the threaded ends of said guide rails.

15. The configurable, modular, extensible computer enclosure system of claim 1 wherein said guide rails are indirectly aligned via the alignment of continuous undulating surfaces on the inner surfaces of said outer enclosures.

* * * * *